United States Patent [19]
Watanabe et al.

[11] Patent Number: 6,025,761
[45] Date of Patent: Feb. 15, 2000

[54] COMPOSITE FILTER WITH LC AND SAW FILTERS AND RADIO EQUIPMENT USING THE SAME

[75] Inventors: Takahiro Watanabe, Shiga-ken; Norio Nakajima, Takatsuki, both of Japan

[73] Assignee: Murata Manufacturing Co., Ltd., Japan

[21] Appl. No.: 09/178,309

[22] Filed: Oct. 23, 1998

[30] Foreign Application Priority Data

Oct. 24, 1997 [JP] Japan .................................. 9-292746

[51] Int. Cl.[7] .............................. H03H 9/72; H03H 9/10
[52] U.S. Cl. ......................... 333/133; 333/175; 333/193
[58] Field of Search ........................... 333/133, 193–196, 333/175

[56] References Cited

U.S. PATENT DOCUMENTS

| | | | |
|---|---|---|---|
| 5,410,742 | 4/1995 | Yajima | 333/193 X |
| 5,525,942 | 6/1996 | Horii et al. | 333/134 |
| 5,815,052 | 9/1998 | Nakajima et al. | 333/185 X |

FOREIGN PATENT DOCUMENTS

| | | |
|---|---|---|
| 0747988 | 12/1996 | European Pat. Off. . |
| 19607500 | 2/1997 | Germany . |
| 3-220911 | 9/1991 | Japan . |
| 9121138 | 5/1997 | Japan . |
| 10-032521 | 2/1998 | Japan . |
| 10-145270 | 5/1998 | Japan . |
| 10-224174 | 8/1998 | Japan . |

OTHER PUBLICATIONS

European Search Report dated Apr. 14, 1999.

*Primary Examiner*—Robert Pascal
*Assistant Examiner*—Barbara Summons
*Attorney, Agent, or Firm*—Ostrolenk, Faber, Gerb & Soffen, LLP

[57] ABSTRACT

The invention provides a composite filter, comprising: a laminate formed by laminating a dielectric layer and a conductor layer; a concave portion provided on at least one major surface of said laminate; a plurality of external terminals provided at least on a side surface of said laminate; a cap sealing the concave portion; a surface acoustic wave filter disposed in said concave portion of said laminate; a LC filter provided within said laminate, said LC filter comprising an inductance element and a capacitance element made of said conductor layer respectively; two of said external terminals being input terminals of said surface acoustic wave filter and said LC filter respectively; and other external terminal being a common output terminal of said surface acoustic wave filter and said LC filter.

In the above composite filter, the number of components is reduced and the assembly process can be simplified.

8 Claims, 8 Drawing Sheets

COMPOSITE FILTER WITH LC AND SAW FILTERS AND RADIO EQUIPMENT USING THE SAME

BACKGROUND OF THE INVENTION

1. Field of the Invention

The present invention relates to a composite filter and a radio equipment using the same and, more particularly, to a composite filter including a surface acoustic wave filter and a LC filter, and a radio equipment using the same.

2. Description of the Related Art

Figure 7:
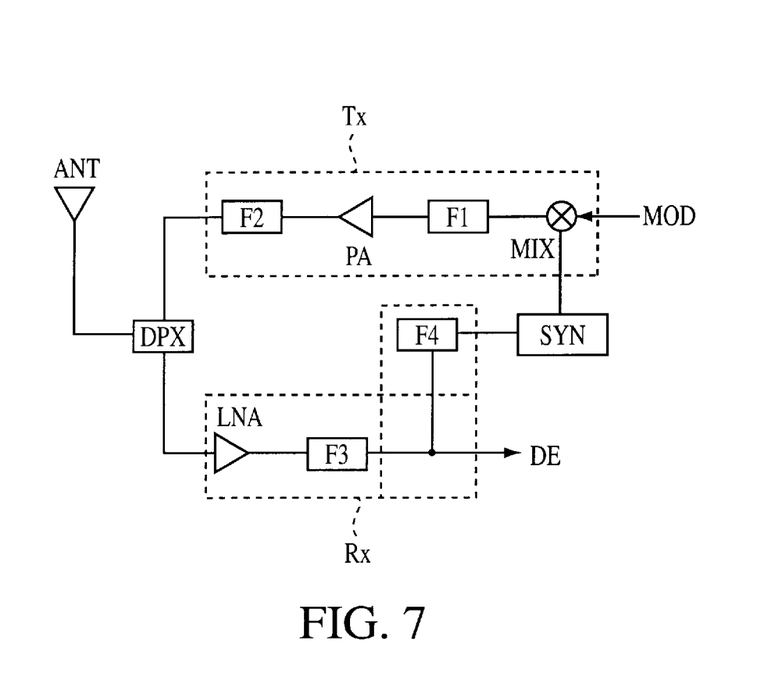
FIG. 7 is a RF block diagram showing a portable telephone terminal equipment which is a conventional radio equipment.

FIG. 7 is a RF block diagram of a portable telephone terminal equipment which is a general radio equipment. The portable telephone terminal equipment shown in FIG. 7 is of a single band type which operates in a single frequency band range of 800 MHz, 1.5 GHz, and so forth contains an antenna ANT, an antenna duplexer DPX, a sending radio signal section Tx, a receiving radio signal section Rx, and a synthesizer section SYN. The input of the sending radio signal section Tx is connected to a modulation section MOD, while the output of the receiving radio signal section Rx is connected to a demodulation DE. The sending radio signal section Tx is made up of a high power amplifier PA, a band pass filter F1, a low pass filter F2, and a mixer MIX, and has a function of outputting a receiving signal, received from the modulation section MOD, through the antenna duplexer DPX to the antenna ANT. On the other hand, the receiving radio signal section Rx is formed of a low-noise amplifier LNA and band pass filters F3, F4, and has a function of outputting a receiving signal, received from the antenna ANT, through the antenna duplexer DPX to the demodulation section DE.

Conventionally, the amplifiers PA, LNA, the mixer MIX, the antenna duplexer DPX made up of a dielectric filter, and the respective filters F1 F4, which are chip components, are mounted on a circuit substrate made of glass epoxy resin, ceramics, or the like, though not shown.

In case of above portable telephone terminal equipment which is a conventional radio equipment, its respective components are intensively integrated in the form of chips.

However, there has arisen a problem that the integration brings an increase in the number of components, complicated assembly process, and so forth.

SUMMARY OF THE INVENTION

The present invention has been devised to solve the above problems, and it is an object of the present invention to provide a composite filter and a radio equipment using the same of which the reduction of the number of components is realizable and the assembly process can be simplified.

The preferred embodiment of the present invetion provides a composite filter, comprising: a laminate formed by laminating a dielectric layer and a conductor layer; a concave portion provided on at least one major surface of said laminate; a plurality of external terminals provided at least on a side surface of said laminate; a cap sealing the concave portion; a surface acoustic wave filter disposed in said concave portion of said laminate; a LC filter provided within said laminate, said LC filter comprising an inductance element and a capacitance element made of said conductor layer respectively; two of said external terminals being input terminals of said surface acoustic wave filter and said LC filter respectively; and other external terminal being a common output terminal of said surface acoustic wave filter and said LC filter.

According to the above composite filter, the surface acoustic wave filter and LC filter are integrated in the laminate. Thus, the number of components can be reduced, and the assembly process can be simplified. The composite filter can fulfil a function comparable to that of a filter formed of the discrete chip components.

The composite filter may have substantially the same size as a conventional surface acoustic wave filter which is a discrete chip component.

Further, since the surface acoustic wave filter and the LC filter are provided with the independent input terminals and the common output, separate high frequency signals passed through the surface acoustic wave filter and the LC filter can be coupled in the composite filter. This enhances the design flexibility.

In the above described composite filter, both of said surface acoustic wave filter and said LC filter may be band-pass filters. Accordingly, signals having required frequencies can be exclusively coupled.

In the above described composite filter, the pass bands of said surface acoustic wave filter and the LC filter may be different from each other. In this case, the composite filter can be used to pass different frequencies. This increases its use flexibility.

The preferred embodiment of the present invention further provides a radio equipment including the above described composite filter, wherein the composite filter is served as a filter constituting a receiving radio signal section. In this case, the number of components for forming the radio equipment can be reduced, and the miniaturization of the radio equipment becomes realizable.

Other features and advantages of the present invention will become apparent from the following description of the invention which refers to the accompanying drawings.

DESCRIPTION OF THE PREFERRED EMBODIMENTS

Figure 1:
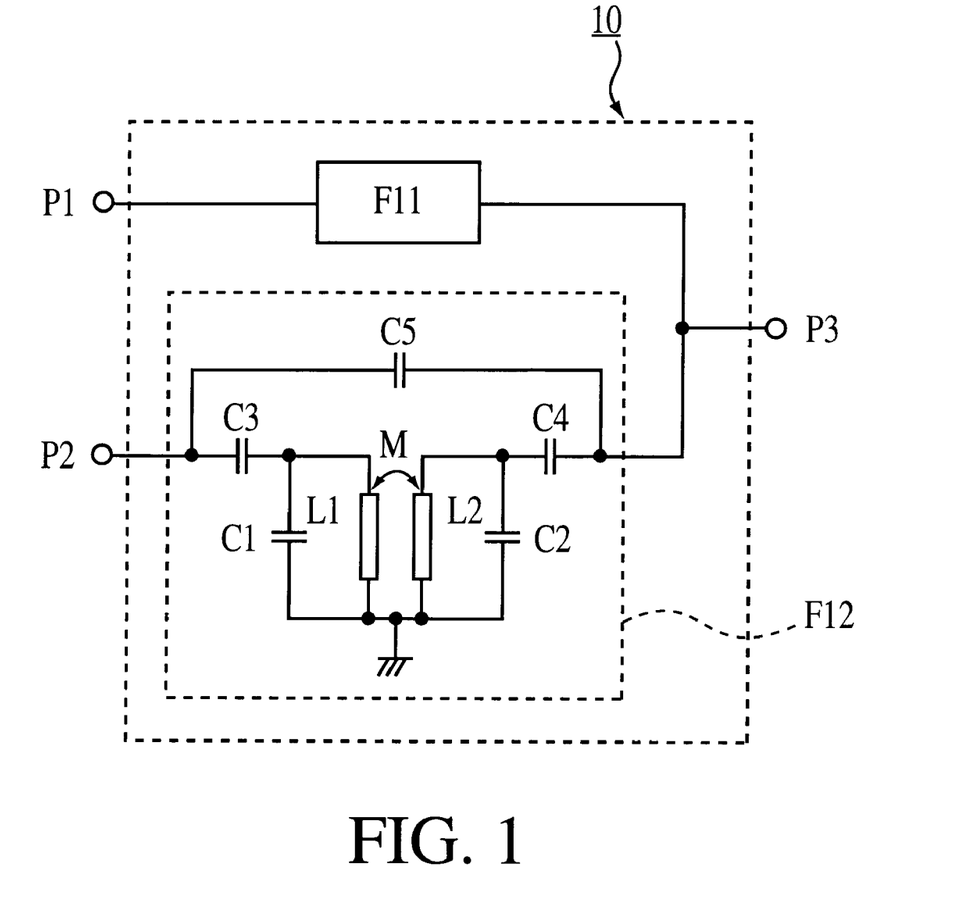
FIG. 1 is a circuit diagram showing a composite filter according to one preferred embodiment of the present invention.

FIG. 1 is a circuit diagram showing a composite filter according to one preferred embodiment of the present invention. The composite filter 10 includes a first port P1 and a second port P2 as input terminals, and a third port as an output terminal. A surface acoustic wave filter F11 is connected between the first port P1 and the third port P3. Transmission lines L1, L2 as inductance elements and a LC filter F12 formed of capacitors C1–C5 as capacitance elements are connected between the second port P2 and the third port P3.

More particularly, the input terminals of the surface acoustic wave filter F11 and the LC filter F12 contains the first port P1, the second port P2, which are independent from each other. The output terminals of the surface acoustic wave filter F11 and the LC filter F12 are common, that is, contain the third port P3. Both of the surface acoustic wave filter F11 and the LC filter F12 are band pass filters.

Concretely, the LC filter F12 comprises a resonance circuit made up of the transmission lines L1 and the capacitor C1 connected in parallel between the second port 2 and the ground, a resonance circuit made up of the transmission line L2 and the capacitors C2 connected in parallel between the third port 3 and the ground, the capacitor C3 connected between the second port P2 and a node at which the transmission lines L1 an the capacitor C1 are joined, the capacitors C4 connected between the third port P3 and a node at which the transmission line L2 and the capacitor C2 are joined, and the capacitor C5 connected between the second port P2 and the third port P3. In this case, the transmission line L1 and the transmission line L2 are coupled at a degree M of magnetic coupling.

Figure 2:
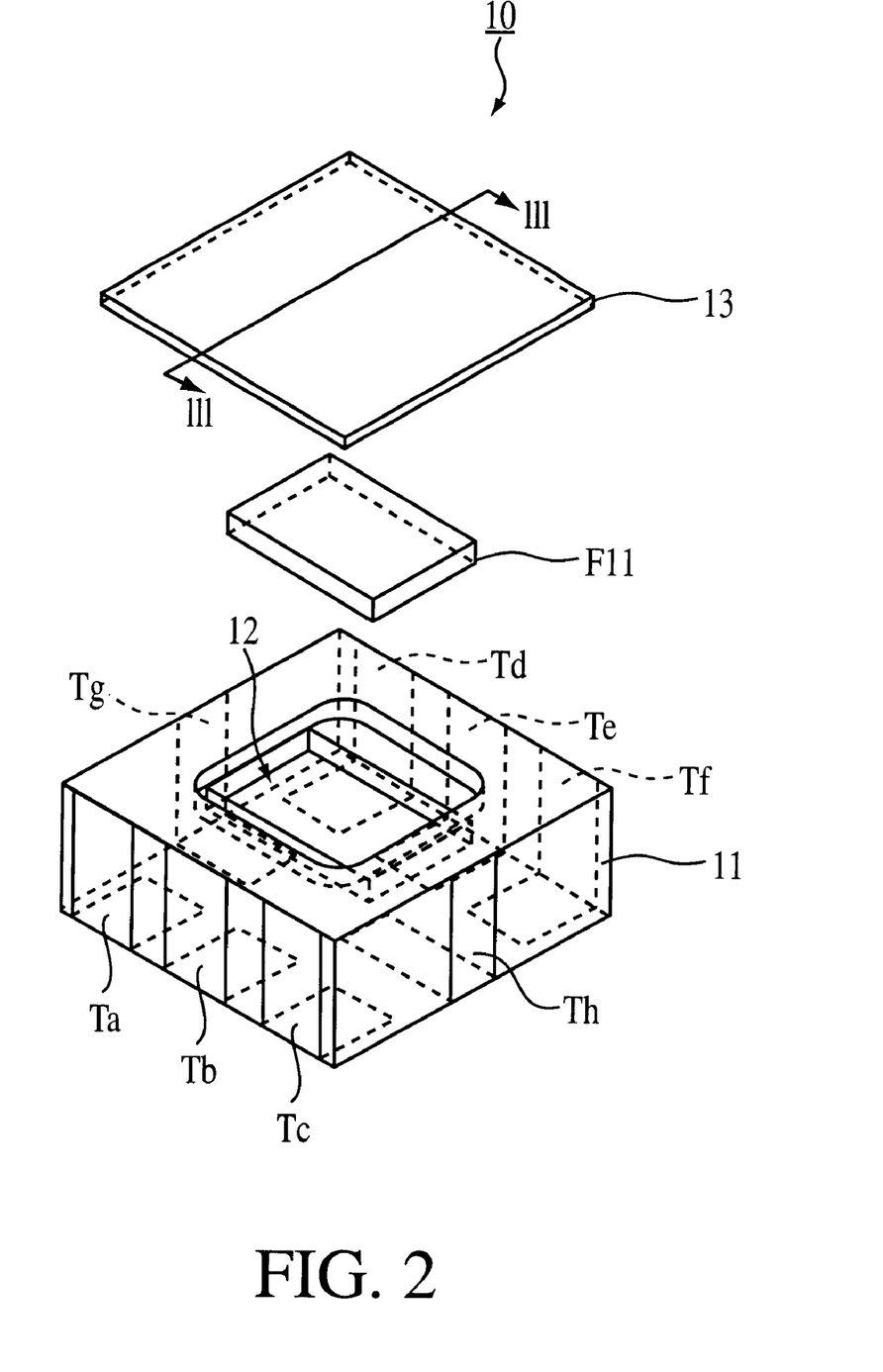
FIG. 2 is an exploded perspective view of the composite filter of FIG. 1.
Figure 3:
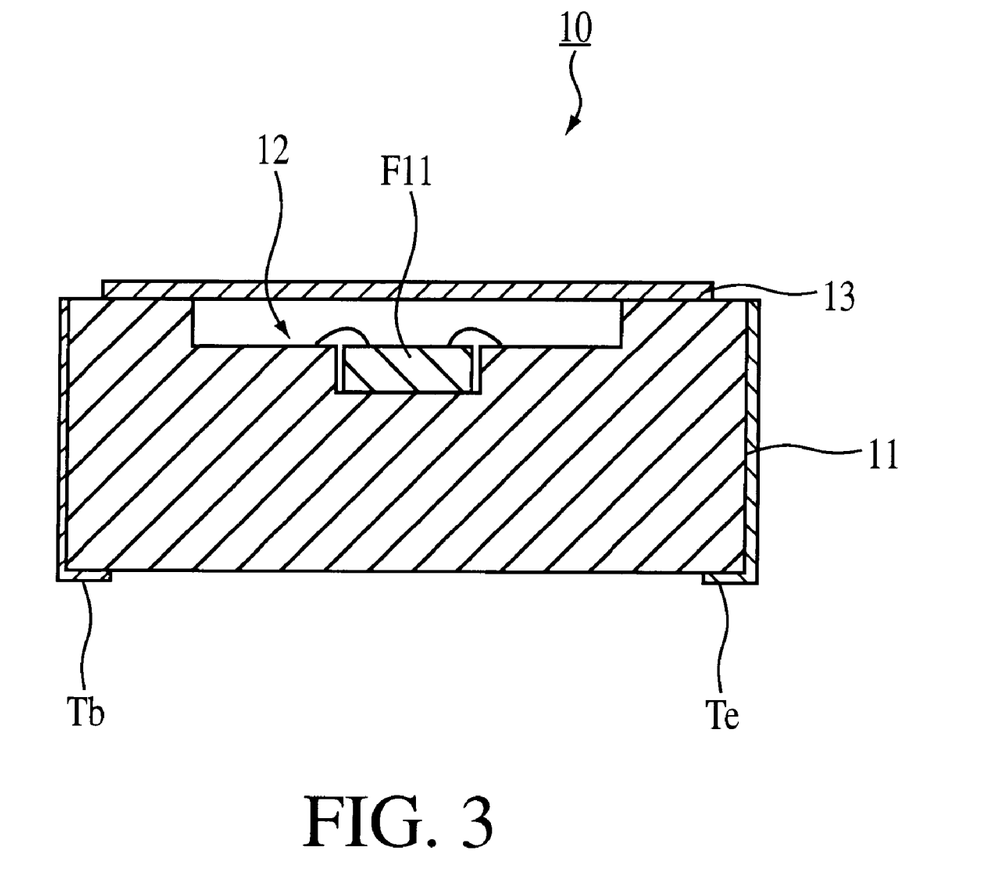
FIG. 3 is a sectional view, taken from the plane of the line III—III of FIG. 2.
Figure 4A:
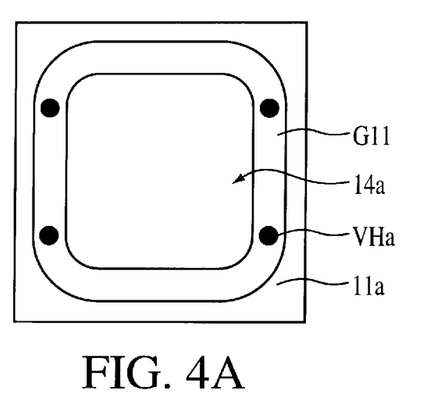
FIGS. 4A to 4H are views showing the tops of the 1–8th dielectric layers to form a laminate of the composite filter.
Figure 4B:
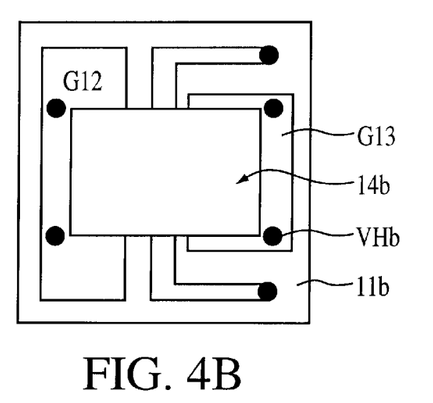
Figure 4C:
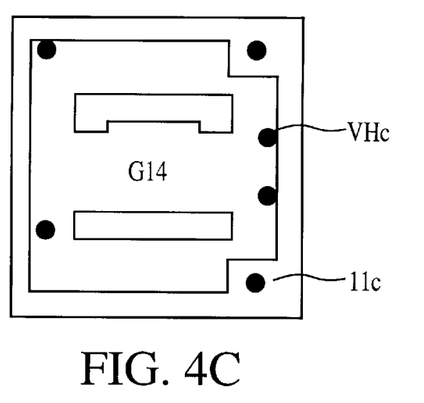
Figure 4D:
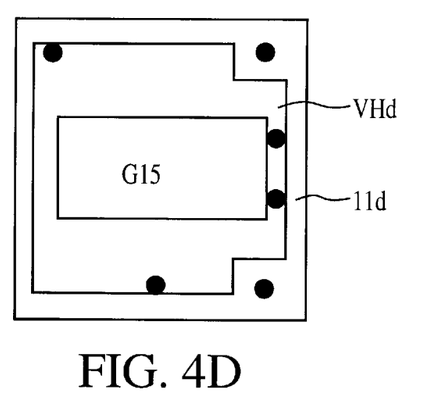
Figure 4E:
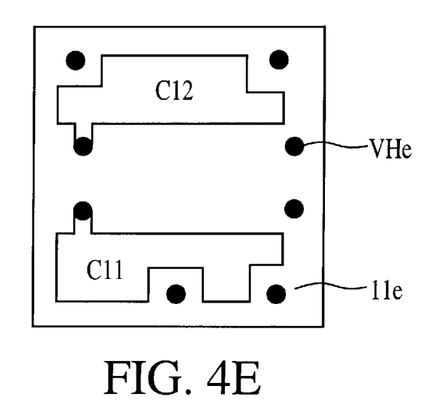
Figure 4F:
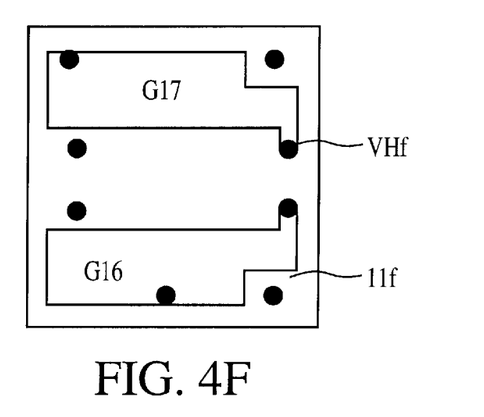
Figure 4G:
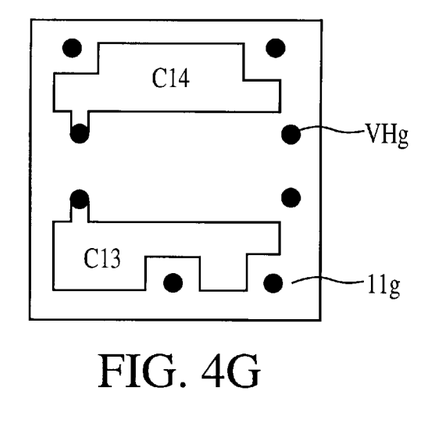
Figure 4H:
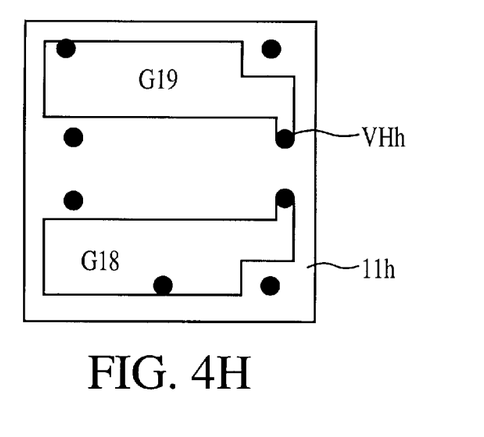
Figure 5A:
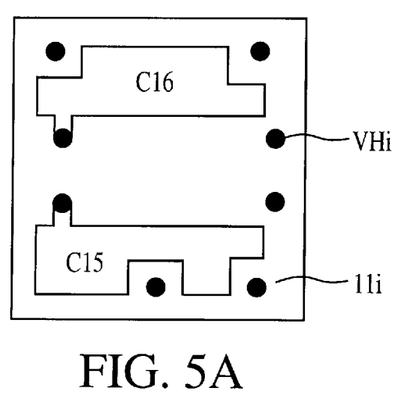
FIGS. 5A to 5G are views showing the tops of the 9–15 dielectric layers.
Figure 5B:
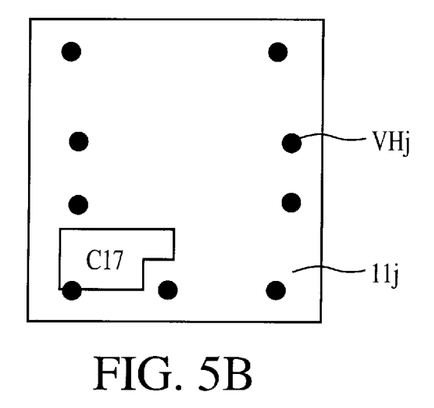
Figure 5C:
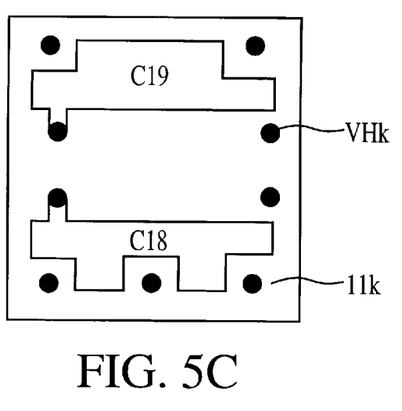
Figure 5D:
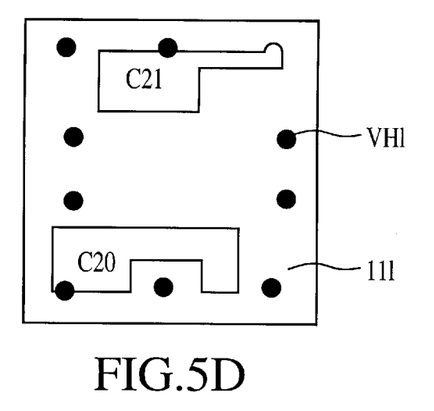
Figure 5E:
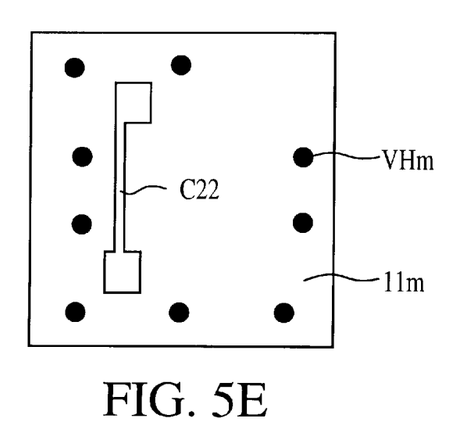
Figure 5F:
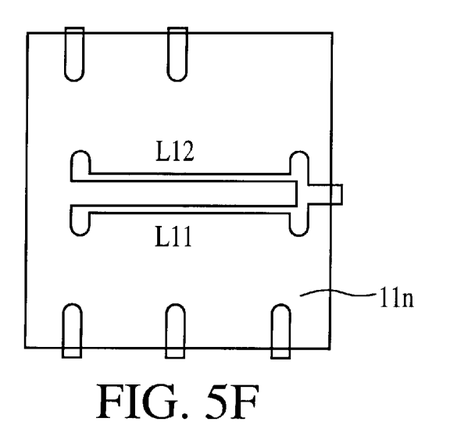
Figure 5G:
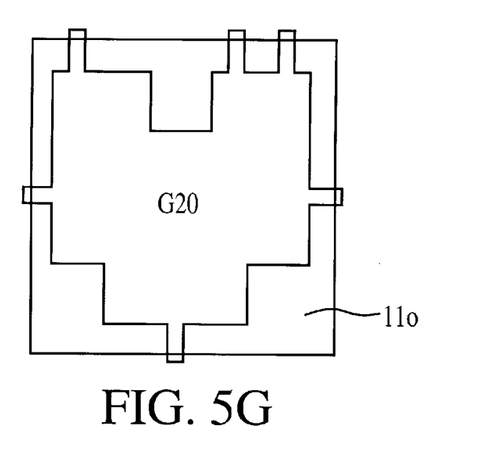
Figure 5H:
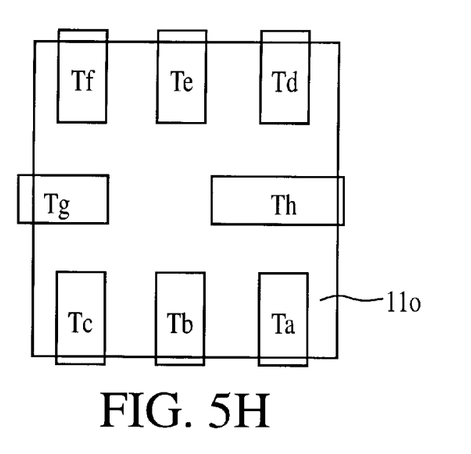
FIG. 5H is a view showing the underside of the 15th dielectric layer.

FIG. 2 is an exploded perspective view of the composite filter 10 of FIG. 1. FIG. 3 is a sectional view of the composite filter 10 of FIG. 1, taken along the plane of the arrow III—III of FIG. 2. The composite filter 10 includes a laminate 11 containing the LC filter F12 (not shown), and is provided with a concave portion 12 in a top face which is one major surface of the laminate 11. The surface acoustic wave filter F11 is disposed in the concave portion 12 of the laminate 11. The concave portion 12 is completely sealed with a metallic cap 13.

Moreover, external terminals T$a$–T$c$ are formed in the back surface of the laminate 11 in the vicinity of the first side of the back surface thereof and in the side surface of the laminate 11 adjacent to the first side of the back surface in such a manner as to cross said side surface. External terminals T$d$–T$f$ are formed in the back surface of the laminate 11 in the vicinity of the second side opposite to the first side of the back surface and in the side surface of the laminate 11 adjacent to the second side of the back surface in such a manner as to cross said side surface. An external terminal T$g$ is formed in the back surface of the laminate 11 in the vicinity of the third side of the back surface adjacent to the first side of the back surface and in the side surface of the laminate 11 adjacent to the third side of the back surface in such a manner as to cross said side surface. An external terminal T$h$ is formed in the back surface of the laminate 11 in the vicinity of the fourth side opposite to the third side of the back surface and in the side surface of the laminate 11 adjacent to the fourth side of the back surface in such a manner as to cross said side surface.

FIGS. 4A to 4H and FIGS. 5A to 5H show the tops and the undersides of the respective electric layers for forming the laminate 11 of the composite filter 10 (FIG. 2, FIG. 3), respectively. The laminate 11 is formed by laminating 1st 15th dielectric layers 11$a$–11$o$, sequentially from the upper side of the laminate 11.

In the 1st, 2nd dielectric layers 11$a$, 11$b$, openings 14$a$, 14$b$ for forming the concave portion 12 of the laminate 11 are provided, respectively. On the tops of the 5th, the 7th and the 9th—the 13th dielectric layers 11$e$, 11$g$, and 11I–11$m$, capacitor electrodes C11–C22 made of conductor layers are formed by printing. Further, on the top of the 14th dielectric layer 11$n$, strip electrodes L11, L12 in a linear shape, made of conductor layers are formed by printing, respectively.

On the tops of the 1st–4th, the 6th, the 8th, and the 15th dielectric layers 11$a$–11$d$, 11$f$, 11$h$, and 11$o$, ground electrodes G11–G20 made of conductor layers are formed by printing. The ground electrode G1 of the 1st dielectric layer 11$a$ also plays a role of a land for attachment of the cap 13 to the laminate 11 to seal the concave portion 12 of the laminate 11. The concave portion 12 is to be sealed by bonding the concave-portion 12 and the cap 13 with a bonding agent such as solder and so forth.

On the underside of the 15th dielectric layer 11$o$ (FIG. 5($h$)), the external terminals T$a$, T$c$, and T$e$ (FIG. 2) for constituting the 1st–3rd ports P1–P3, and external terminals T$b$, T$d$, T$f$, T$g$, and T$h$ (FIG. 2) for constituting the ground terminals are formed by printing. Moreover, in predetermined positions of the 1st–13th dielectric layers 11$a$–11 $m$, via-hole electrodes VH$a$ - V H$m$ are provided to connect the capacitor electrodes C11–C22, the strip electrodes L 11, L12, and the ground electrodes G1–G20.

The capacitor electrodes C 11, C13, and C15 and the ground electrodes G 15, G16, and G18 make up the capacitor C1 (FIG. 1) of the LC filter F12. The capacitor electrodes C12, C14, and C16, and the ground electrodes C15, C17, and C19 make up the capacitor C 2 (FIG. 1) of the LC filter F12. The capacitor electrodes C15, C17, C18, and C20 make up the capacitor C 3 (FIG. 1) of the LC filter F12. The capacitor electrodes C19, C21 make up the capacitor C4 (FIG. 1) of the LC filter F12. The capacitor electrodes C20, C21, and C22 make up the capacitor C5 (FIG. 1) of the LC filter F12.

The strip electrode L11 forms the transmission line L1 (FIG. 1) of the LC filter F12. The strip electrode L12 forms the transmission line L2 (FIG. 1) of the LC filter F12.

The surface acoustic wave filter F11 is disposed in the concave portion 12 formed in the surface of the laminate 11 formed as described above. Thus, the surface acoustic wave filter F11 and the LC filter F12 contained in the laminate 11 are integrated in the laminate 11.

Figure 6:
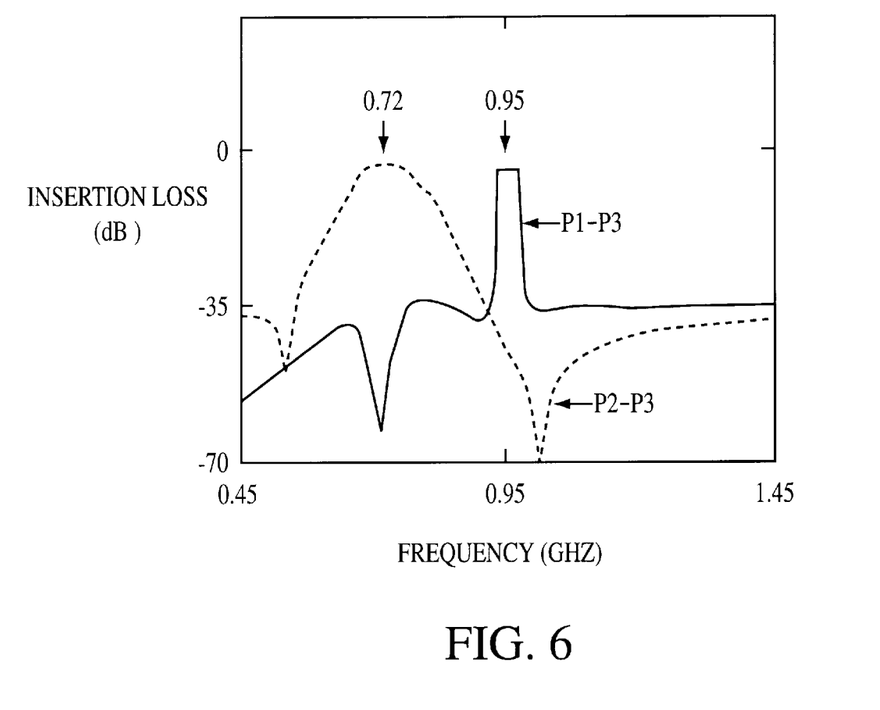
FIG. 6 illustrates insertion losses between the 1st port and the 3rd port and between the 2nd port and the 3rd port.

Insertion losses between the 1st port P1 and the 3rd port P3 (surface acoustic wave filter Fll) and between the 2nd port P2 and the 3rd port P3 (LC filter F12) are illustrated in FIG. 6. In FIG. 6, the full line represents the insert loss between P 1 and P3, and the broken line does that between P2 and P3.

As seen in FIG. 6, the surface acoustic wave filter F11 between the 1st port P1 and the 3rd port P3 and the LC filter 12 between the 2nd port P2 and the 3 rd port P3 fulfil functions comparable to those of the discrete surface acoustic wave filter and LC filter. This means that the mutual interference between the surface acoustic wave filter F11 and the LC filter F12 integrated in the laminate 11 is satisfactorily inhibited.

In the above embodiment, since the composite filter includes the surface acoustic wave filter F11 and the LC filter F12 integrated in the laminate 11, the number of components can be reduced, and the assembly process can be simplified. Further, the composite filter having performances comparable to those of its discrete chip components can be obtained.

The composite filter, having both functions as the surface acoustic wave filter and the LC filter, can be produced substantially in the same size as the conventional surface acoustic wave filter which is a discrete chip component, having a size of 3.8 mm (L)×3.8 mm (W)×2.0 mm (H).

The surface acoustic wave filter and the LC filter are provided with the independent input terminals and the common output terminal. Thus, separate high frequency signals passed through the surface acoustic wave filter and the LC filter can be coupled in the composite filter. This enhances design flexibility. For instance, in the receiving radio signal section Rx of FIG. 7, the surface acoustic wave filter F11 of the composite filter may be used as the band pass filter F3 for passing a receiving frequency signal, and the LC filter 12 of composite filter 10 may be done as the band pass filter F4 for passing an intermediate-frequency signal.

Both of the surface acoustic wave filter and the LC filter which form the composite filter are band pass filters. Thus, signals having required frequencies can be exclusively coupled.

Moreover, the pass bands of the LC filter and the surface acoustic wave filter are made different, avoiding overlapping. Thus, the composite filter can be used to pass different frequencies. This enhances its use flexibility.

The surface acoustic wave filter and the LC filter making up the composite filter is served as a filter which forms a receiving radio signal section of a radio equipment. Accordingly, the number of components for the radio equipment can be reduced. The radio equipment can be miniaturized.

For instance, a portable telephone terminal equipment for GSM (Global System for Mobile Communication) can be miniaturized by using the surface acoustic wave filter F11 (intermediate frequency : 0.95 (GHz)) of the composite filter 10, as shown in FIG. 6, as the band pass filter F3 of the receiving radio signal section Rx, and the LC filter F12 (intermediate frequency : 0.72 (GHz)) as the band pass filter F4 for passing an intermediate frequency, that is, by connecting the external terminal T*a* (the 1 st port P1) of the composite filter 10 to the output of the low noise amplifier LNA, the external terminal T*c* (the 2 nd port P2) to the output of the synthesizer section SYN, and the external terminal T*e* (the 3 rd port P3) to the input of the demodulation section DE, respectively.

In the above embodiment, the case where both of the surface acoustic wave filter and LC filter are band pass filters has been described. Also in the case that the surface acoustic wave filter and the LC filter are a low pass filter, a high pass filter, and/or a band rejection filter, the same effects as described in the above embodiment can be obtained.

For the purpose of impedance correction, a inductor for impedance correction may be connected between a node of the surface acoustic wave filter and the LC filter and the ground.

While the invention has been particularly shown and described with reference to preferred embodiments thereof, it will be understood by those skilled man in the art that the forgoing and other changes in form and details may be made therein without departing from the spirit of the invention.

What is claimed is:

1. A composite filter, comprising:
   a laminate formed by laminating a dielectric layer and a conductor layer;
   a concave portion provided on at least one major surface of said laminate;
   a plurality of external terminals provided at least on a side surface of said laminate;
   a cap sealing the concave portion;
   a surface acoustic wave filter disposed in said concave portion of said laminate;
   a LC filter provided within said laminate, said LC filter comprising an inductance element and a capacitance element comprising said conductor layer respectively;
   two of said external terminals being input terminals of said surface acoustic wave filter and said LC filter respectively; and
   another external terminal being a common output terminal of said surface acoustic wave filter and said LC filter.

2. The composite filter according to claim 1, wherein both of said surface acoustic wave filter and said LC filter are band-pass filters.

3. The composite filter according to any one of claims 1 and 2, wherein the pass bands of said surface acoustic wave filter and the LC filter are different from each other.

4. A receiver comprising:
   a) a composite filter, the composite filter having:
      a laminate formed by laminating a dielectric layer and a conductor layer;
      a concave portion provided on at least one major surface of said laminate;
      a plurality of external terminals provided at least on a side surface of said laminate;
      a cap sealing the concave portion;
      a surface acoustic wave filter disposed in said concave portion of said laminate;
      a LC filter provided within said laminate, said LC filter comprising an inductance element and a capacitance element comprising said conductor layer respectively;
      two of said external terminals being input terminals of said surface acoustic wave filter and said LC filter respectively; and
      another external terminal being a common output terminal of said surface acoustic wave filter and said LC filter;
   b) an amplifier circuit, the amplifier circuit being connected in series with said composite filter;
   c) a signal source for receiving a signal and supplying said signal to the series combination of said amplifier circuit and said composite filter.

5. The receiver according to claim 4, wherein said amplifier circuit is connected in series between said signal source and said composite filter.

6. The receiver according to claim 4, wherein both of said surface acoustic wave filter and said LC filter are band-pass filters.

7. The receiver according to claim 6, wherein the pass bands of said surface acoustic wave filter and said LC filter are different from each other.

8. The receiver according to claim 4, wherein the pass bands of said surface acoustic wave filter and said LC filter are different from each other.

* * * * *